(12) United States Patent
Kume et al.

(10) Patent No.: US 10,026,715 B2
(45) Date of Patent: Jul. 17, 2018

(54) SEMICONDUCTOR DEVICE AND MANUFACTURING METHOD THEREOF

(71) Applicant: TOSHIBA MEMORY CORPORATION, Minato-ku (JP)

(72) Inventors: Ippei Kume, Oita (JP); Kazuyuki Higashi, Oita (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/064,971

(22) Filed: Mar. 9, 2016

(65) Prior Publication Data

US 2016/0276313 A1    Sep. 22, 2016

(30) Foreign Application Priority Data

Mar. 17, 2015 (JP) .................. 2015-053874

(51) Int. Cl.
*H01L 25/065* (2006.01)
*H01L 23/31* (2006.01)
*H01L 21/768* (2006.01)
*H01L 23/48* (2006.01)
*H01L 23/00* (2006.01)

(52) U.S. Cl.
CPC ........ H01L 25/0657 (2013.01); H01L 23/481 (2013.01); *H01L 23/3128* (2013.01); *H01L 23/562* (2013.01); *H01L 2224/16145* (2013.01); *H01L 2225/06513* (2013.01); *H01L 2225/06541* (2013.01); *H01L 2924/15311* (2013.01); *H01L 2924/181* (2013.01); *H01L 2924/18161* (2013.01)

(58) Field of Classification Search
CPC ............... H01L 25/0657; H01L 23/481; H01L 23/3128; H01L 23/562
See application file for complete search history.

(56) References Cited

U.S. PATENT DOCUMENTS

| 9,589,840 B2 | 3/2017 | Kao et al. |
| 2007/0013062 A1 | 1/2007 | Kobayashi et al. |
| 2009/0189297 A1 | 7/2009 | Sugawara et al. |
| 2010/0044880 A1 | 2/2010 | Aokura et al. |
| 2010/0171226 A1 | 7/2010 | West et al. |
| 2011/0193228 A1 | 8/2011 | Yu et al. |
| 2011/0207322 A1 | 8/2011 | Yamaguchi |
| 2012/0119384 A1 | 5/2012 | Takii et al. |
| 2012/0241981 A1 | 9/2012 | Hirano |

FOREIGN PATENT DOCUMENTS

| JP | 2000-260811 A | 9/2000 |
| JP | 2004-186651 A | 7/2004 |
| JP | 2007-49115 | 2/2007 |

(Continued)

*Primary Examiner* — Seahvosh Nikmanesh
(74) *Attorney, Agent, or Firm* — Oblon, McClelland, Maier & Neustadt, L.L.P.

(57) ABSTRACT

A semiconductor device according to the present embodiment includes a semiconductor substrate, an insulating film and a conductive film. The insulating film is disposed on a first surface of the semiconductor substrate. The insulating film covers a semiconductor element. The conductive film penetrates the semiconductor substrate across from the first surface to a second surface opposite to the first surface. On the second surface, a trench continuously or intermittently exists across from a first end part side of the second surface to a second end part side thereof.

15 Claims, 11 Drawing Sheets

(56) References Cited

FOREIGN PATENT DOCUMENTS

| | | |
|---|---|---|
| JP | 2009-76839 A | 4/2009 |
| JP | 2009-123733 | 6/2009 |
| JP | 2009-182004 | 8/2009 |
| JP | 2010-278306 | 12/2010 |
| JP | 2011-171567 | 9/2011 |
| JP | 2011-249718 | 12/2011 |
| JP | 2011-258687 A | 12/2011 |
| JP | 2012-9473 | 1/2012 |
| JP | 2012-204444 | 10/2012 |
| JP | 2012-204618 A | 10/2012 |
| JP | 2014-11194 | 1/2014 |
| TW | 200947649 A | 11/2009 |
| TW | 201444033 A | 11/2014 |

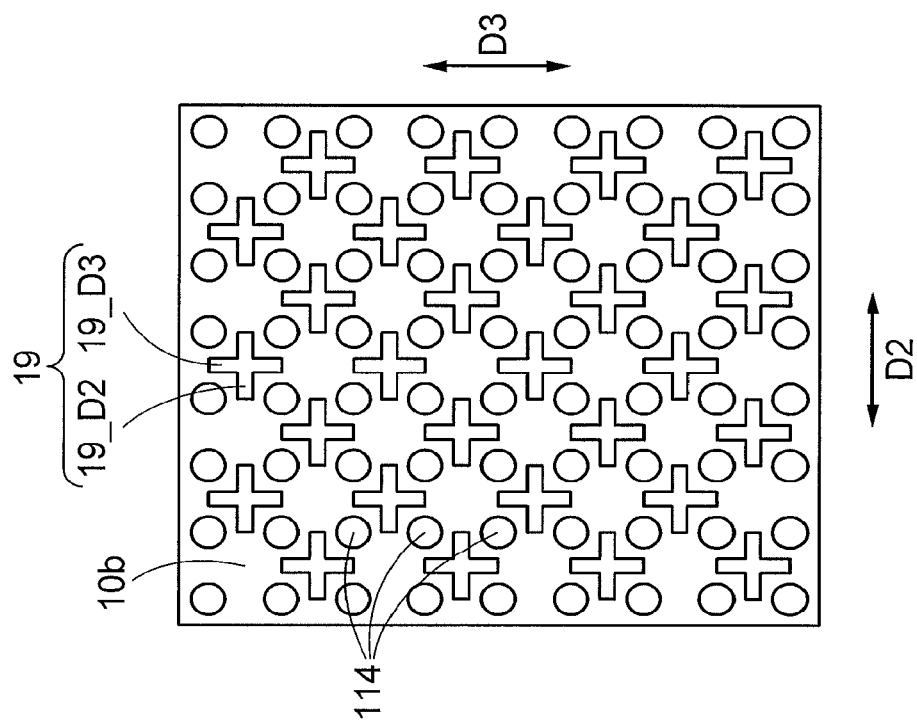

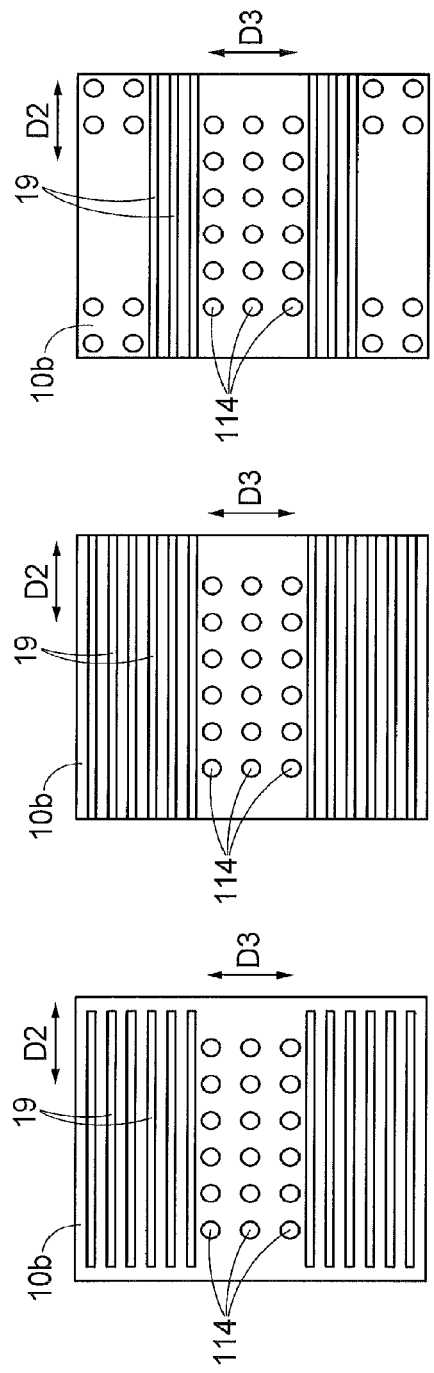

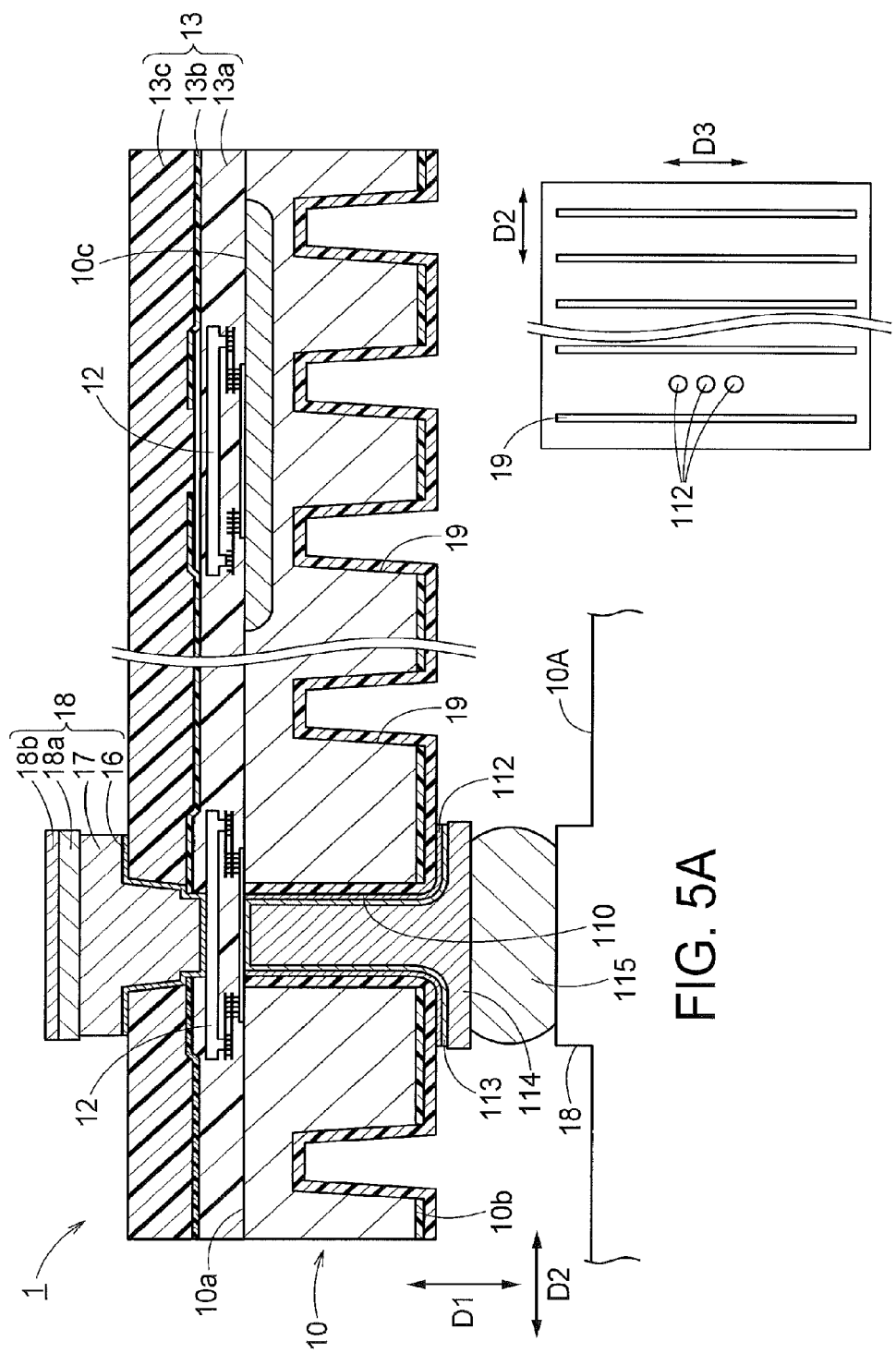

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2015-53874, filed on Mar. 17, 2015, the entire contents of which are incorporated herein by reference.

FIELD

Embodiments of the present invention relate to a semiconductor device and a manufacturing method thereof.

BACKGROUND

Recently, 3-D or 2.5-D stacked-type semiconductor devices (multichips) using TSVs (Through-Silicon Vias) are attracting attention from a viewpoint of high functionality and the like of semiconductor devices.

However, in a manufacturing process of the stacked-type semiconductor devices using TSVs, silicon substrates (chips) that hardly undergo elastic deformation have been electrically connected to one another with bumps. Since the silicon substrate hardly undergoes elastic deformation, the heights of the bumps have not been matched to one another in the plane of the silicon substrate when warpage of the silicon substrate is large. Further, the heights of the bumps not being matched to one another problematically causes difficulty in securing reliability of electric connection of the silicon substrates with bumps.

Due to this, in the stacked-type semiconductor devices, warpage of the semiconductor substrates is desired to be suppressed in order to secure reliability of electric connection of the semiconductor substrates.

BRIEF DESCRIPTION OF THE DRAWINGS

FIG. 3 is a bottom view of the semiconductor device 1 illustrating a first modification of the first embodiment;

FIG. 4A is a bottom view illustrating a first arrangement example of strip-shaped slits, FIG. 4B is a bottom view illustrating a second arrangement example thereof, FIG. 4C is a bottom view illustrating a third arrangement example thereof, FIG. 4D is a bottom view illustrating a fourth arrangement example thereof, and FIG. 4E is a bottom view illustrating a fifth arrangement example thereof;

FIG. 5A is a schematic cross-sectional view of a semiconductor device, and FIG. 5B is a bottom view of FIG. 5A;

DETAILED DESCRIPTION

A semiconductor device according to the present embodiment includes a semiconductor substrate, an insulating film and a conductive film. The insulating film is disposed on a first surface of the semiconductor substrate. The insulating film covers a semiconductor element. The conductive film penetrates the semiconductor substrate across from the first surface to a second surface opposite to the first surface. On the second surface, a trench continuously or intermittently exists across from a first end part side of the second surface to a second end part side thereof.

Embodiments will now be explained with reference to the accompanying drawings. The present invention is not limited to the embodiments.

First Embodiment

Figure 1:
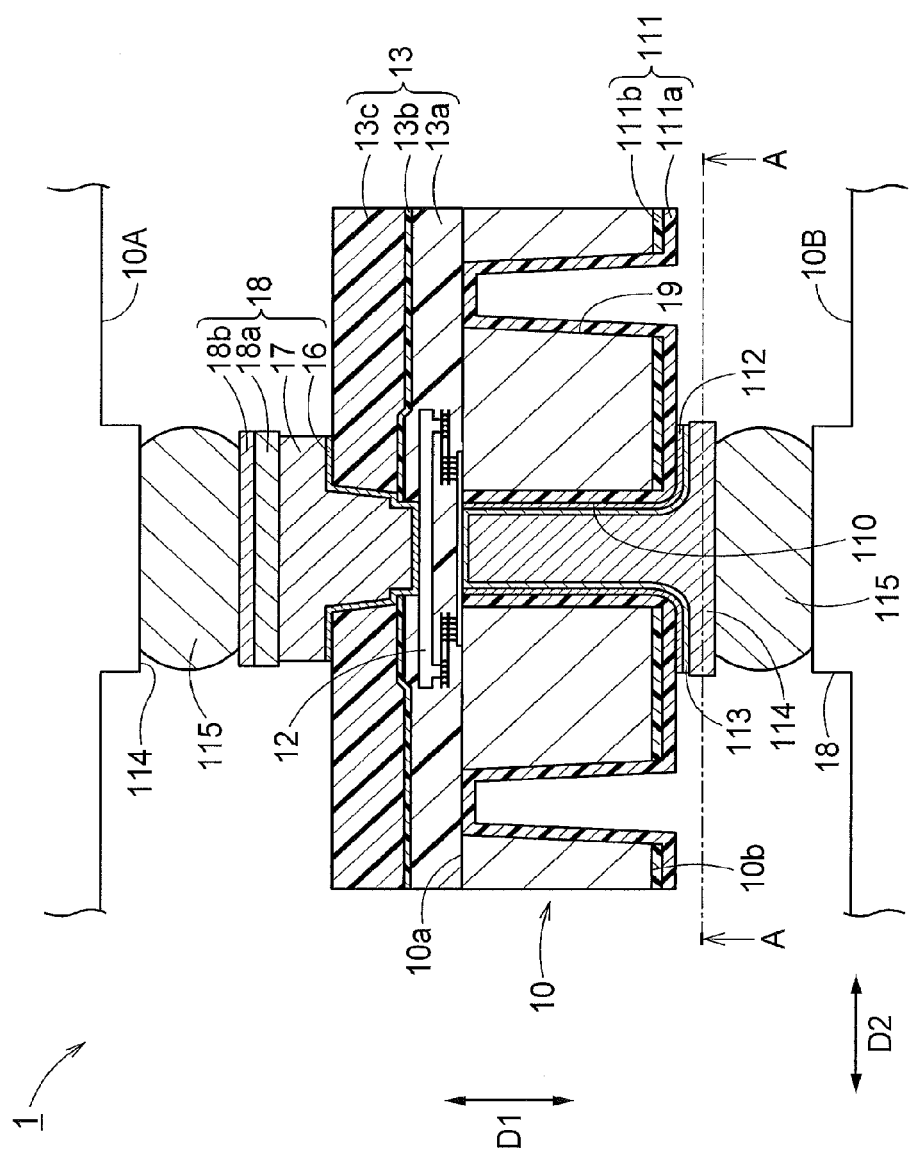
FIG. 1 is a schematic cross-sectional view of a semiconductor device 1 illustrating a first embodiment.
Figure 2B:
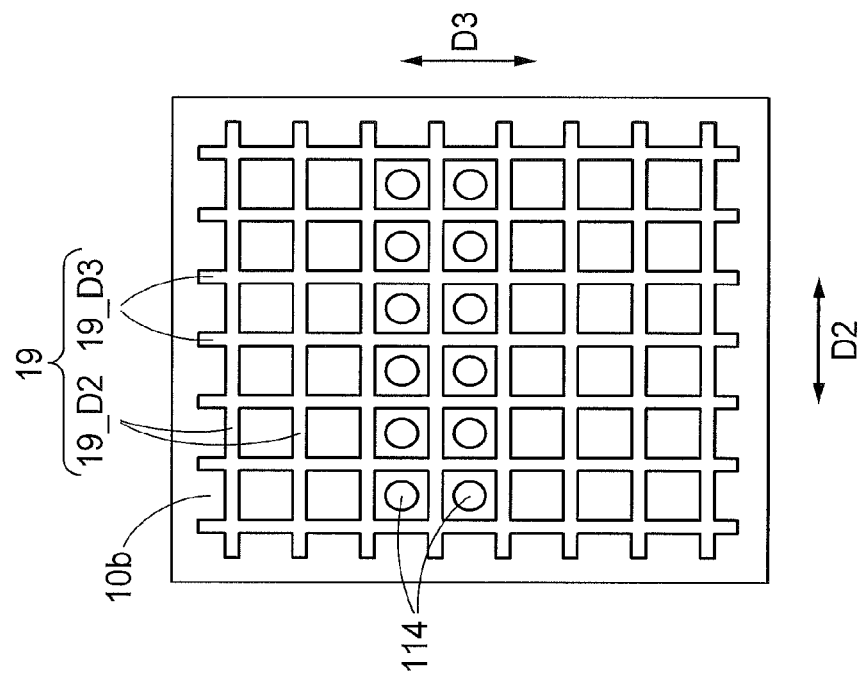
FIG. 2B is a bottom view illustrating a second arrangement example of the slits.
Figure 2A:
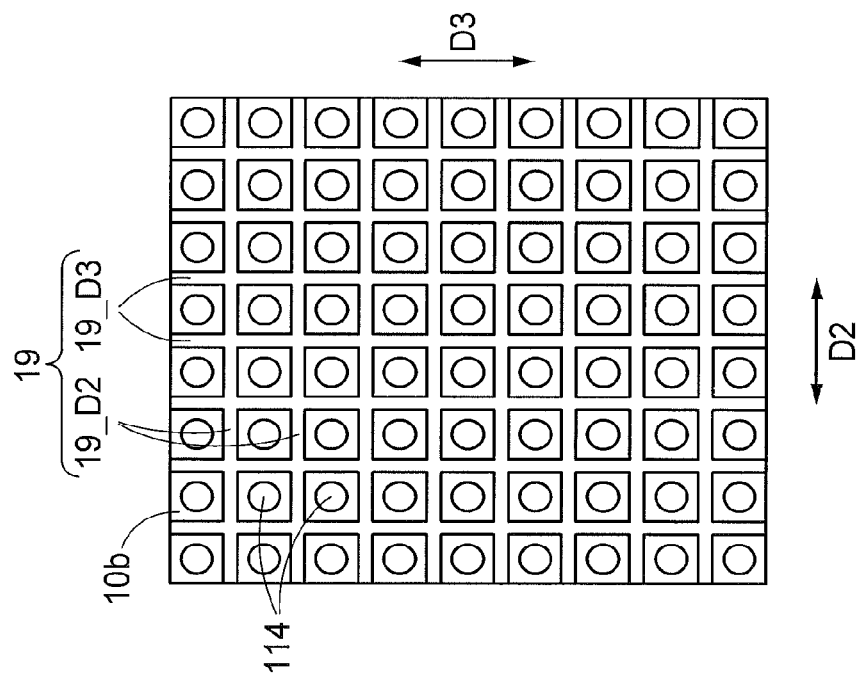
FIG. 2A is a bottom view illustrating a first arrangement example of slits.

FIG. 1 is a schematic cross-sectional view of a semiconductor device 1 illustrating a first embodiment. FIG. 2A and FIG. 2B are bottom views (cross-sectional views taken along A-A in FIG. 1) illustrating arrangement examples of slits 19 in the semiconductor device 1 of FIG. 1. Specifically, FIG. 2A is a bottom view illustrating a first arrangement example of the slits 19 and FIG. 2B is a bottom view illustrating a second arrangement example of the slits 19. Notably, in the specification, a D1 direction in FIG. 1 is defined as a thickness direction of the semiconductor device 1, a D2 direction in FIG. 1 as a width direction of the semiconductor device 1, and a D3 direction in FIG. 2 as a depth direction of the semiconductor device 1.

As illustrated in FIG. 1, the semiconductor device 1 includes a semiconductor substrate 10. The semiconductor substrate 10 is, for example, a silicon substrate. Moreover, the semiconductor device 1 includes a semiconductor element 12 (device), an insulating film 13 covering the semiconductor element 12 and a bump 18 (joint) on a front surface 10a (first surface; one end face in the thickness direction D1) of the semiconductor substrate 10. The bump 18 contains a barrier metal film 16 and a rewiring film 17. Another semiconductor substrate 10A which opposes the semiconductor substrate 10 upward thereof (one orientation in the thickness direction D1) is joined with the bump 18. The semiconductor substrate 10A may have the similar structure to that of the semiconductor substrate 10.

Moreover, the semiconductor device 1 includes slits 19 as trenches, a through hole 110, an insulating film 111, a barrier metal film 112, a metal film 113, a conductive film 114 and a bump 115 (joint) on a rear surface 10b (second surface; the other end face in the thickness direction D1), opposite to the front surface 10a, of the semiconductor substrate 10. Another semiconductor substrate 10B which opposes the semiconductor substrate 10 downward thereof (the other orientation in the thickness direction D1) is joined with the bump 115. The semiconductor substrate 10B may have the similar structure of that of the semiconductor substrate 10.

The films 12, 13 and 16 to 18 on the front surface 10a of the semiconductor substrate 10 may be formed through a wafer process or a wafer-level packaging process.

The semiconductor element 12 is, for example, a controller of a memory. The semiconductor element 12 is not limited to the aspect in FIG. 1. The semiconductor element 12 may have a 3-D stacking structure in which layers are stacked in the thickness direction D1.

The insulating film 13 includes, for example, an oxide film ($SiO_2$) 13a (interlayer insulating film) which is in contact with the front surface 10a of the semiconductor substrate 10, a nitride film (SiN) 13b which is in contact with a front surface of the oxide film 13a, and a photosensitive resin layer (for example, polyimide) 13c which is in contact with a front surface of the nitride film 13b. The insulating film 13 is not limited to the aspect in FIG. 1.

The barrier metal film 16 prevents a film forming material of the rewiring film 17 from diffusing into the insulating film 13. The barrier metal film 16 is formed (provided in a recess) from a front surface of the insulating film 13 to a position of reaching the semiconductor element 12. The barrier metal film 16 may be, for example, a Ti film, not limited to this. The rewiring film 17 is electrically connected to the semiconductor element 12 at an upper layer of the barrier metal film 16. The rewiring film 17 may be, for example, a Cu film, not limited to this.

The bump 18 includes, for example, a Ni layer 18a which is in contact with a front surface of the rewiring film 17, and an Au layer 18b which is in contact with a front surface of the Ni layer 18a. The bump 18 is not limited to the aspect in FIG. 1.

On the other hand, the structures 19 and 110 to 115 on the rear surface 10b of the semiconductor substrate 10 may be formed after the semiconductor substrate is made thin. The semiconductor substrate 10 may be made thin to have a thickness not more than 100 μm.

As illustrated in FIG. 2A, the slits 19 are formed (exist) continuously across from one end (first end part) of the rear surface 10b to the other end (second end part) thereof in the width direction D2 and from one end (first end part) of the rear surface 10b to the other end (second end part) thereof in the depth direction D3.

Specifically, as to the slits 19, a plurality of strip-shaped slit parts 19_D2 which extend from one end to the other end in the width direction D2 and line up in the depth direction D3, a plurality of strip-shaped slit parts 19_D3 which extend from one end to the other end in the depth direction D3 and line up in the width direction D2 intersect (are perpendicular) to each other. Namely, the slits 19 are formed into a continuous grid shape over the whole surface on the rear surface 10b.

Moreover, the slits 19 are formed separately from the conductive film 114 so as not to interfere with the conductive film 114.

Notably, as illustrated in FIG. 2B, the slits 19 may be formed, into a continuous grid shape, across from the vicinity of one end (first end part side) of the rear surface 10b to the vicinity of the other end (second end part side) thereof in the width direction D2 and from the vicinity of one end (first end part side) to the vicinity of the other (second end part side) in the depth direction D3.

Moreover, as illustrated in FIG. 1, the slits 19 penetrate the semiconductor substrate 10 across from the front surface 10a to the rear surface 10b. Moreover, as illustrated in FIG. 1, an inner wall of the slit 19 may be inclined with respect to the thickness direction D1 of the semiconductor device 1.

Namely, the dimension of the slit 19 in the width direction D2 may be reduced from the rear surface 10b toward the front surface 10a.

The slits 19 may be formed by reactive ion etching (RIE). The slits 19 may be formed before forming the through hole 110. By forming the slits 19 before forming the through hole 110, the semiconductor element 12 can be prevented from being contaminated via the through hole 110 in a forming step of the slits 19.

The slits 19 can relieve stress, of the semiconductor substrate 10, cause by the structure, material or the like of the semiconductor element 12 (internal stress) to suppress warpage of the semiconductor substrate 10 (bend in the thickness direction D1).

The through hole 110 penetrates the semiconductor substrate 10 across from the front surface 10a to the rear surface 10b at the position corresponding to the semiconductor element 12. The plurality of through holes 110 are formed in the semiconductor substrate 10. The through holes 110 are, for example, via holes for TSVs. The through holes 110 may be formed, for example, by reactive ion etching.

The insulating film 111 covers the rear surface 10b of the semiconductor substrate 10, an inner circumferential wall of the through hole 110, the inner walls of the slits 19, and a rear surface of the insulating film 13. The insulating film 111 includes, for example, an oxide film ($SiO_2$) 111a and a nitride film (SiN) 111b. The insulating film 111 is not limited to the aspect in FIG. 1.

The barrier metal film 112 covers the insulating film 111 inside the through hole 110 and at the opening part outer edge of the through hole 110. The barrier metal film 112 may be, for example, Ti, not limited to this. Moreover, the barrier metal film 112 may be formed by dry etching.

The conductive film 114 penetrates the semiconductor substrate 10 across from the front surface 10a to the rear surface 10b inside the through hole 110. The conductive film 114 is electrically connected to the semiconductor element 12. The conductive film 114 is, for example, a TSV. The conductive film 114 inscribes the barrier metal film 112 via the metal film 113. The metal film 113 may be, for example, a Cu film, not limited to this.

The conductive film 114 may also be, for example, a Ni film. The conductive film 114 may be formed, for example, through a plating process such as electroplating and non-electrolytic plating. As illustrated in FIG. 2A, the conductive film 114 may be formed between the grid of the slits 19 over the whole area of the rear surface 10b. Otherwise, as illustrated in FIG. 2B, the conductive film 14 may be formed locally (for example, in the center part in the depth direction D3) between the grid of the slits 19.

The bump 115 in FIG. 1 electrically and mechanically connects the semiconductor substrate 10 to the opposing semiconductor substrate 10B. The bump 115 is in contact with a rear surface of the conductive film 114. The bump 115 may be, for example, Sn, Cu or the like.

Herein, in order to properly connect the semiconductor substrate 10 to the semiconductor substrate 10B, the heights of the plurality of bumps 115 formed at places on the rear surface 10b of the semiconductor substrate 10 preferably match one another on the rear surface 10b. Nevertheless, in the case of adopting the semiconductor element 12 (device) that is fine and complex such as a device having a 3-D structure, the complexity in device structure and material composition of the semiconductor element 12 causes local difference in coefficient of thermal expansion due to the semiconductor element 12 to be liable to arise in the semiconductor substrate 10.

If the thickness of the semiconductor substrate 10 is uniform, the difference in coefficient of thermal expansion caused by the semiconductor element 12 causes stress (internal stress) in the semiconductor substrate 10 to arise, which causes the semiconductor substrate 10 to be liable to warp. The warpage of the semiconductor substrate 10 results in difficulty in matching the heights of the bumps 115 to one another.

Moreover, if the slits 19 are formed locally (for example, only in the periphery of the conductive film 114), although local stress can be reduced, this is still insufficient to suppress the warpage of the whole semiconductor substrate 10. Accordingly, in the case where the slits 19 are locally formed, it is still difficult to match the heights of the bumps 115 to one another.

On the contrary, in the present embodiment, the slits 19 are formed in a wide range across between the end parts of the rear surface 10b of the semiconductor substrate 10, and thereby, the stress of the semiconductor substrate 10 caused by the semiconductor element 12 can be sufficiently relieved. To sufficiently relieve the stress can sufficiently suppress the warpage of the semiconductor substrate 10. To sufficiently suppress the warpage of the semiconductor substrate 10 can match the heights of the bumps 115 to one another, which enables the semiconductor substrate 10 to be properly connected to the semiconductor substrate 10B.

Accordingly, according to the semiconductor device 1 of the first embodiment, warpage of the semiconductor substrate 10 can be suppressed. As a result, 3-D packaging of semiconductor substrates can be properly performed and yield can be improved.

Moreover, according to the semiconductor device 1 of the first embodiment, the slits 19 are formed into a grid shape, and thereby, the thickness of the semiconductor substrate 10 can be made intermittently thin in the directions D2 and D3 which intersect. By doing so, in spite of a simple configuration, stress of the semiconductor substrate 10 can be efficiently relieved.

For example, the strip-shaped slit parts 19_D3 extending in the depth direction D3 in FIGS. 2A and 2B can effectively suppress warpage of the semiconductor substrate 10 (bend in the thickness direction D1) with respect to the width direction D2. Moreover, the strip-shaped slit parts 19_D2 extending in the width direction D2 in FIGS. 2A and 2B can effectively suppress warpage of the semiconductor substrate 10 with respect to the depth direction D3. Accordingly, the grid-shaped slits 19 can effectively suppress warpage of the semiconductor substrate 10 with respect to any direction of the directions D2 and D3 which are perpendicular to each other. Moreover, warpage with respect to a combined direction of the width direction D2 and the depth direction D3 (oblique direction) can be considered as warpage obtained by combining warpage with respect to the width direction D2 and warpage with respect to the depth direction D3. Since the grid-shaped slits 19 can effectively suppress any of the warpage with respect to the width direction D2 and the warpage with respect to the depth direction D3, they can also effectively suppress the warpage as to the combined direction. Moreover, the combined direction can be any orientation perpendicular to the thickness direction D1. Accordingly, the grid-shaped slits 19 can effectively suppress warpage with respect to any of all of the orientations.

Warpage of the semiconductor substrate 10 may be caused not only by the semiconductor element 12 but also by the material and the like of a constituent part of the semiconductor device 1 other than the semiconductor element 12. The slits 19 may also suppress warpage of the semiconductor substrate 10 caused by a constituent part of the semiconductor device 1 other than the semiconductor element 12.

(First Modification)

Next, as a first modification of the first embodiment, an example of the semiconductor device that includes cross-shaped slits is described. Notably, as to the description of the first modification, the same signs are used for constituent parts corresponding to those of the semiconductor device 1 in FIG. 1, and their duplicated description is omitted.

FIG. 3 is a bottom view of the semiconductor device 1 illustrating the first modification of the first embodiment. As illustrated in FIG. 3, on the rear surface 10b of the semiconductor substrate 10 of the first modification, the plurality of slits 19 are formed intermittently (discretely; discontinuously) across from the vicinity of one end to the vicinity of the other in the width direction D2 and from the vicinity of one end to the vicinity of the other end in the depth direction D3. Each slit 19 has a cross shape in which the slit part 19_D2 extending in the width direction D2 and the slit part 19_D3 extending in the depth direction D3 intersect (are perpendicular to each other).

Also in the semiconductor device 1 of the first modification, similarly to the configurations in FIGS. 2A and 2B, since the slits 19 can sufficiently relieve stress of the semiconductor substrate 10, warpage of the semiconductor substrate 10 can be suppressed. Moreover, the slits 19 are formed into cross shapes, and thereby, in spite of a simple configuration, stress of the semiconductor substrate 10 can be efficiently relieved. Moreover, there is a case where the continuous grid-shaped slits 19 as in FIGS. 2A and 2B are difficult to form depending on a layout of the conductive films 114. According to the intermittent cross-shaped slits 19, the layout of the slits 19 can be easily adjusted so as not to interfere with the conductive films 114 depending on the layout of the conductive films 114. Accordingly, according to the first modification, warpage of the semiconductor substrate 10 can be suppressed, and flexibility in designing (layout) of the conductive films 114 (semiconductor elements 12) can be improved.

(Second Modification)

Next, as a second modification of the first embodiment, an example of the semiconductor device that includes strip-shaped slits is described. Notably, as to the description of the second modification, the same signs are used for constituent parts corresponding to those of the semiconductor device 1 in FIG. 1, and their duplicated description is omitted.

FIG. 4A to FIG. 4E are bottom views of the semiconductor device 1 illustrating the second modification of the first embodiment. Specifically, FIG. 4A is a bottom view illustrating a first arrangement example of the strip-shaped slits, FIG. 4B a second arrangement example thereof, FIG. 4C a third arrangement example thereof, FIG. 4D a fourth arrangement example thereof, and FIG. 4E a fifth arrangement example thereof.

The slits 19 in FIG. 4A extend to be strip-shaped across from the vicinity of one end of the rear surface 10b to the vicinity of the other end thereof in the width direction D2. Moreover, the plurality of slits 19 are provided to line up in the depth direction D3 separately from each other. The slits 19 in FIG. 4B extend to be strip-shaped across from one end to the other end in the width direction D2, and the plurality of slits 19 are provided to line up in the depth direction D3 separately from each other. In the configurations of FIG. 4A and FIG. 4B, the plurality of conductive films 114 are unevenly distributed on the center side in the depth direction D3. While the slits 19 in FIG. 4C take a configuration in which they are across from one end to the other end in width direction D2 similarly to FIG. 4B, the number of the slits 19 is reduced depending on the layout of the conductive films 114. The configuration in FIG. 4D is different from the configuration in FIG. 4A in that one slit 19 is added in the center part in the depth direction D3. The slits 19 in FIG. 4E extend to be strip-shaped across from the vicinity of one end of the rear surface 10b to the vicinity of the other end thereof in the depth direction D3, and the plurality of slits 19 are provided to line up in the width direction D2 separately from each other. In FIG. 4E, the conductive films 114 are arranged between the individual slits 19.

Also in the semiconductor device 1 of the second modification, similarly to the configurations in FIGS. 2A and 2B, since the slits 19 can sufficiently relieve stress of the semiconductor substrate 10, warpage of the semiconductor substrate 10 can be suppressed. The slits 19 in FIG. 4A to FIG. 4D can effectively suppress warpage of the semiconductor substrate 10 with respect to the depth direction D3 in a simple configuration. The slits 19 in FIG. 4E can effectively suppress warpage of the semiconductor substrate 10 with respect to the width direction D2 in a simple configuration.

(Third Modification)

Next, as a third modification of the first embodiment, an example of the semiconductor device in which the slits are bottomed grooves is described. Notably, as to the description of the third modification, the same signs are used for constituent parts corresponding to those of the semiconductor device 1 in FIG. 1, and their duplicated description is omitted.

FIG. 5A and FIG. 5B are views of the semiconductor device 1 illustrating the third modification of the first embodiment. Specifically, FIG. 5A is a schematic cross-sectional view of the semiconductor device 1 and FIG. 5B is a bottom view of FIG. 5A. Notably, in FIGS. 5A and 5B, the semiconductor substrate 10A (refer to FIG. 1) on the upper layer side is omitted from the illustration.

As illustrated in FIG. 5A, the slits 19 of the third modification are different from the slits 19 in FIG. 1 in that they are bottomed grooves. Namely, the slits 19 are formed from the rear surface 10b to positions behind the front surface 10a (on the rear surface 10b side). Specifically, for example, an impurity diffusion layer 10c (well) for securing a channel region of the semiconductor element 12 is formed on the front surface 10a of the semiconductor substrate 10. The slits 19 are formed to positions behind the impurity diffusion layer 10c so as not to interfere with the impurity diffusion layer 10c. Notably, the impurity is not specially limited in regard to its specific aspect, but may also be P, B, C, As or the like.

According to the semiconductor device 1 of the third modification, in addition to that warpage of the semiconductor substrate 10 can be suppressed, influence of the slits 19 on characteristics of the device can be reduced.

Second Embodiment

Figure 6:
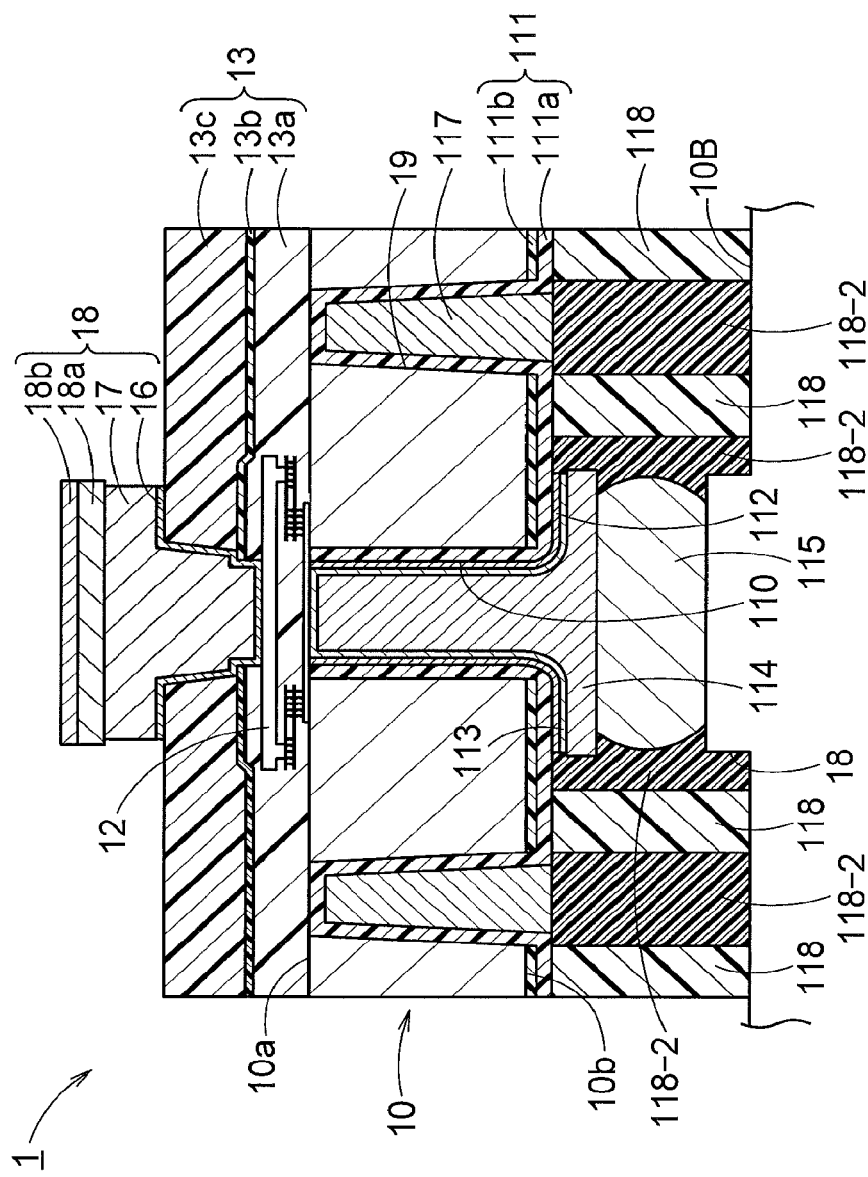
FIG. 6 is a schematic cross-sectional view of the semiconductor device 1 illustrating a second embodiment.

Next, as a second embodiment, an embodiment of the semiconductor device in which a reinforcing film is embedded in the slit is described. Notably, as to the description of the second embodiment, the same signs are used for constituent parts corresponding to those in the first embodiment, and their duplicated description is omitted. FIG. 6 is a schematic cross-sectional view of the semiconductor device 1 illustrating the second embodiment. Notably, in FIG. 6, the semiconductor device 10A (refer to FIG. 1) on the upper layer side is omitted from the illustration.

As illustrated in FIG. 6, the semiconductor device 1 of the second embodiment includes a reinforcing film 117 which is embedded in the slit 19 (is in contact with the inner wall of the slit 19) inside the slit 19. The reinforcing film 117 reinforces the semiconductor substrate 10. The reinforcing film 117 may have higher hardness than that of the semiconductor substrate 10. The reinforcing film 117 may be a metal single-layer film or stacked-layer film. In this case, the reinforcing film 117 may be, for example, Ti, TiN, W, Al, Ni, Cu, or a stacked-layer film of these. Moreover, the reinforcing film 117 may be a single-layer film or a stacked-layer film of insulator. In this case, the reinforcing film 117 may be, for example, $SiO_2$, SiN, SiON, or a stacked-layer film of these.

Figure 7A:
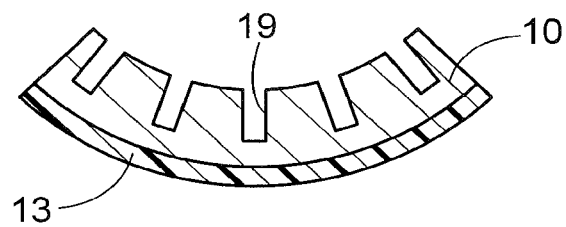
FIG. 7A is a schematic cross-sectional view illustrating a semiconductor substrate in which slits are formed.
Figure 7B:
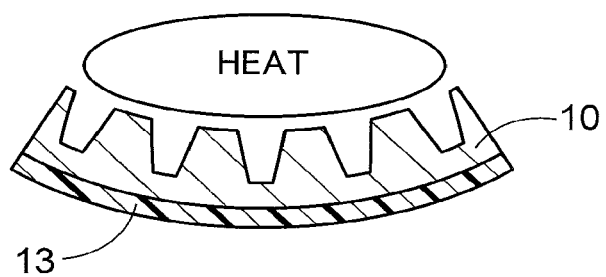
FIG. 7B is a schematic cross-sectional view illustrating a heating step of the semiconductor substrate.
Figure 7C:
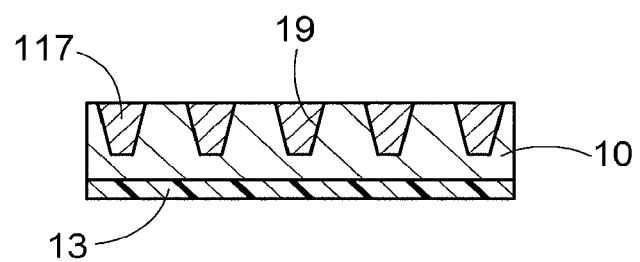
FIG. 7C is a schematic cross-sectional view illustrating a film forming step of reinforcing films.

Next, a manufacturing method of the semiconductor device of the second embodiment having the above-mentioned configuration is described. FIG. 7A to FIG. 7C are schematic cross-sectional views illustrating a manufacturing method of the semiconductor device 1 in FIG. 6. FIG. 7A is a schematic cross-sectional view illustrating the semiconductor substrate 10 in which the slits 19 are formed. FIG. 7B is a schematic cross-sectional view illustrating a heating step of the semiconductor substrate 10. FIG. 7C is a schematic cross-sectional view illustrating a film forming step of the reinforcing films 117. Notably, in FIG. 7A to FIG. 7C, the constituent parts other than the slits 19 and the reinforcing films 117 are simplified from the illustration.

In the case where stress in the semiconductor substrate 10 due to the semiconductor elements 12 is large, as illustrated in FIG. 7A, there can be a case where warpage of the semiconductor substrate 10 cannot be relieved even in the case of forming the slits 19.

With respect to such a semiconductor substrate 10, in the manufacturing method of the present embodiment, the semiconductor substrate 10 is heated to relieve the warpage of the semiconductor substrate 10 (FIG. 5B). A heating temperature of the semiconductor substrate 10 is desirable to be a high temperature at which the various films formed on the semiconductor substrate 10 are not caused to deteriorate. For example, the heating temperature of the semiconductor substrate 10 may be 150 to 400° C. Heating of the semiconductor substrate 10 may be performed with an apparatus for forming the reinforcing films 117 (for example, a CVD apparatus).

Next, while the semiconductor substrate 10 is being heated, the reinforcing films 117 are formed inside the slits 19 (FIG. 5C). The reinforcing films 117 may be formed by CVD.

According to the semiconductor device 1 of the second embodiment, even when warpage cannot be completely relieved with the slits 19, warpage can be relieved by heating the semiconductor substrate 10. Furthermore, the reinforcing films 117 are embedded in the slits 19, and thereby, the reinforcing films 117 can cause counterforce against stress of warpage to act on the semiconductor substrate 10 even when the semiconductor substrate 10 is about to warp again while cooling. By doing so, warpage of the semiconductor substrate 10 can be suppressed from re-arising. Accordingly, according to the second embodiment, warpage of the semiconductor substrate 10 can be further securely suppressed.

(Modification)

Figure 8:
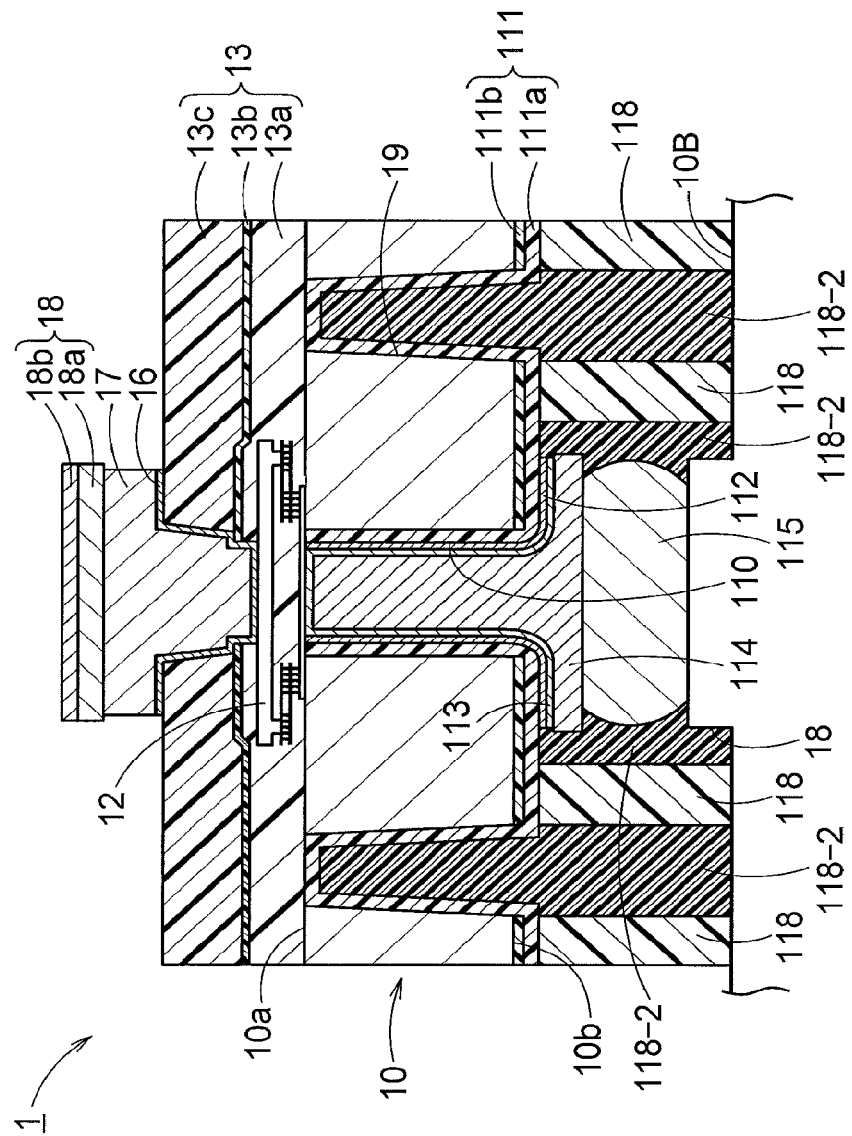
FIG. 8 is a schematic cross-sectional view of the semiconductor device 1 illustrating a modification of the second embodiment.

Next, as a modification of the second embodiment, an embodiment of the semiconductor device in which a sealing resin is embedded in the slits is described. Notably, as to the description of the modification of the second embodiment, the same signs are used for constituent parts corresponding to those in the first embodiment, and their duplicated description is omitted. FIG. 8 is a schematic cross-sectional view of the semiconductor device 1 illustrating the modification of the second embodiment. In FIG. 8, the semiconductor device 10A (refer to FIG. 1) on the upper layer side is omitted from the illustration.

As illustrated in FIG. 8, in the semiconductor device 1 of the present modification, a resin 118 is provided between the semiconductor substrate 10 and the lower-layer semiconductor substrate 10B. Moreover, a sealing resin 118-2 is provided in another gap between the semiconductor substrate 10 and the lower-layer semiconductor substrate 10B, that is, in a space between the resins 118. Further, the sealing resin 118-2 is disposed inside the slit 19. The sealing resin 118-2 in the slit 19 functions as the reinforcing film.

According to the present modification, since the resin 118 in the slit 19 can cause counterforce against stress of warpage to act on the semiconductor substrate 10 even when the semiconductor substrate 10 is about to warp, warpage can be suppressed from arising. Accordingly, according to the semiconductor device 1 of the present modification, similarly to the semiconductor substrate 10 in FIG. 6, warpage of the semiconductor substrate 10 can be securely suppressed. Moreover, since resin sealing between the semiconductor substrates 10 and 10A and embedding of the resins 118 in the slits 19 can also be in the same step, manufacturing efficiency can be improved.

Third Embodiment

Figure 9:
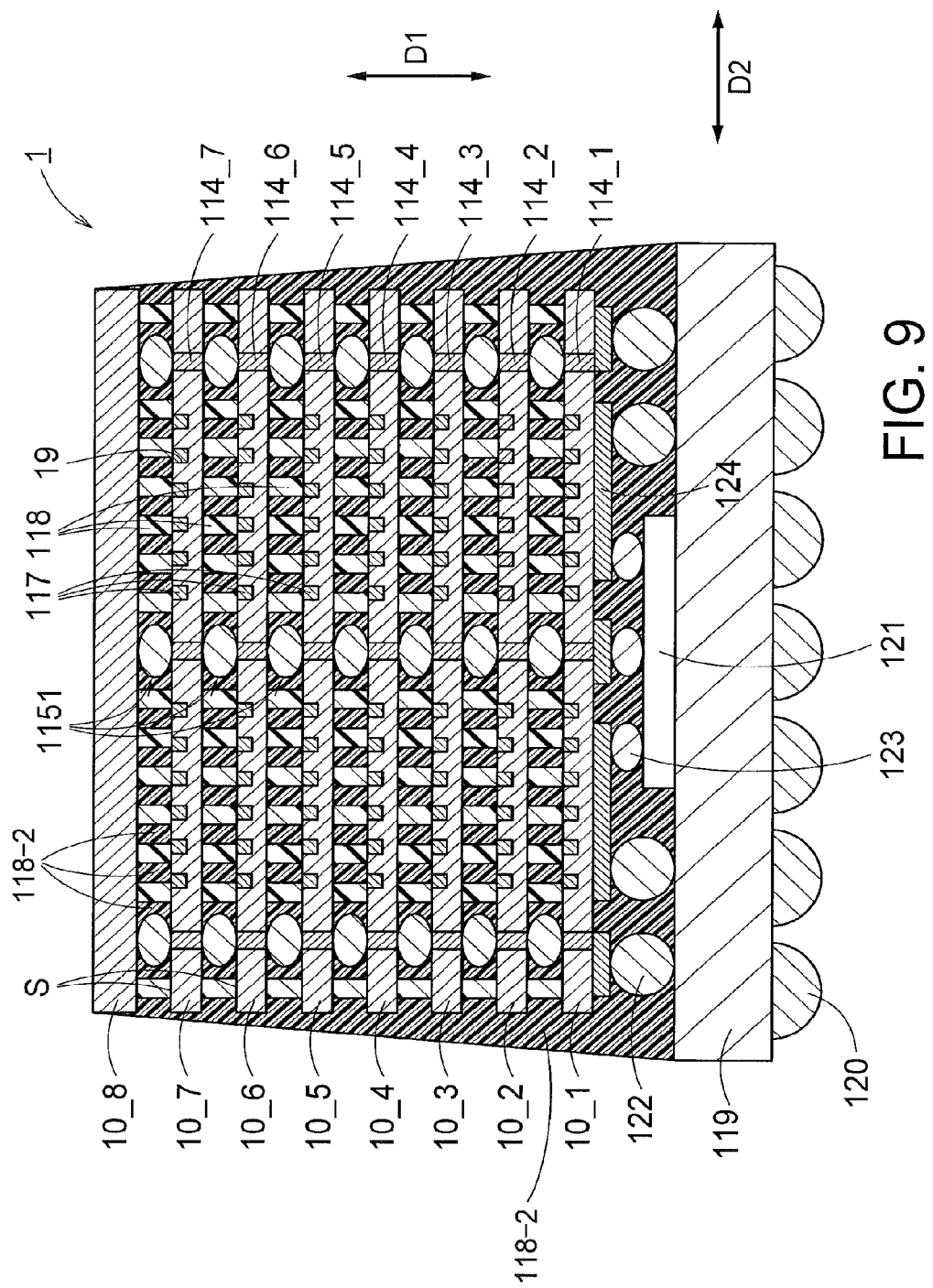
FIG. 9 is a schematic cross-sectional view of the semiconductor device 1 illustrating a third embodiment.

Next, as a third embodiment, an embodiment of a stacked-type semiconductor device in which TSVs are used is described. Notably, as to the description of the third embodiment, the same signs are used for constituent parts corresponding to those in the first embodiment, and their duplicated description is omitted. FIG. 9 is a schematic cross-sectional view of the semiconductor device 1 illustrating the third embodiment.

As illustrated in FIG. 9, the semiconductor device 1 of the third embodiment includes a BGA (Ball Grid Array) substrate 119, and a plurality of layers (three or more) of silicon chips 10_1 to 10_8 (semiconductor substrates) which are mounted (joined; connected) on the BGA substrate 119 via bumps 122 and 123.

The silicon chips 10_1 to 10_8 are stacked and arranged in the thickness direction D1 of the semiconductor device 1 separately from one another. On the silicon chips 10_1 to 10_8, not-shown wiring and semiconductor elements (devices) may be formed.

On an upper face of the BGA substrate 119, an IC chip 121 is formed. Meanwhile, on a lower face of the BGA substrate 119, bumps 120 are formed.

The first layer (lowermost layer) silicon chip 10_1 of the plurality of layers of silicon chips includes wiring 124 for connection to the BGA substrate 119 on its lower face. The wiring 124 is connected to the upper face of the BGA substrate 119 via the first bumps 122. Moreover, the wiring 124 is connected to the IC chip 121 via the second bumps 123. Moreover, the silicon chip 10_1 is penetrated by TSVs 114_1 each of which is an example of the conductive film.

The second layer to seventh layer silicon chips 10_2 to 10_7 are positioned between (in the midway of) the upper silicon chip and the lower silicon chip. The second layer to seventh layer silicon chips 10_2 to 10_7 are also penetrated by TSVs 114_2 to 114_7.

The eighth layer (uppermost layer) silicon chip 10_8 is a base chip and does not include a TSV.

Neighboring ones of the silicon chips 10_1 to 10_8 in the thickness direction D1 allow ones of the TSVs 114_1 to 114_7 to oppose each other. Further, the neighboring TSVs are joined by a bump 1151 as a joint. Notably, the bump 1151 may be one having two bumps 115 and 18 in FIG. 1 bonded.

Moreover, a gap between the neighboring silicon chips is sealed with the resin 118.

Moreover, the slits 19 are formed on upper faces S of the first layer to seventh layer silicon chips 10_1 to 10_7. The upper faces S of the silicon chips 10_1 to 10_7 may correspond to the rear surface 10b of the semiconductor substrate 10 in FIG. 1. In this case, the semiconductor device 1 of the third embodiment may correspond to the configuration in which the stacked structure for the semiconductor substrate 10 in FIG. 1 is reversed upside down.

Moreover, the reinforcing films 117 similar to those in FIG. 6 are arranged inside the slits 19 of the first layer to seventh layer silicon chips 10_1 to 10_7.

Such a semiconductor device 1 can be mounted on a not-shown circuit board via the bumps 120.

Since a silicon chip is a material that hardly undergoes elastic deformation, 3-D packaging with TSVs is difficult when warpage occurs. On the contrary, in the third embodiment, since stress of warpage of the silicon chips 10_1 to 10_7 can be relieved with the slits 19, the warpage of the silicon chips 10_1 to 10_7 can be suppressed. Moreover, since the reinforcing films 117 can reinforce the silicon chips 10_1 to 10_7, the warpage of the silicon chips 10_1 to 10_7 can be further effectively suppressed.

Accordingly, according to the third embodiment, reliability of electric connection in 3-D packaging using TSVs can be secured.

(First Modification)

Figure 10:
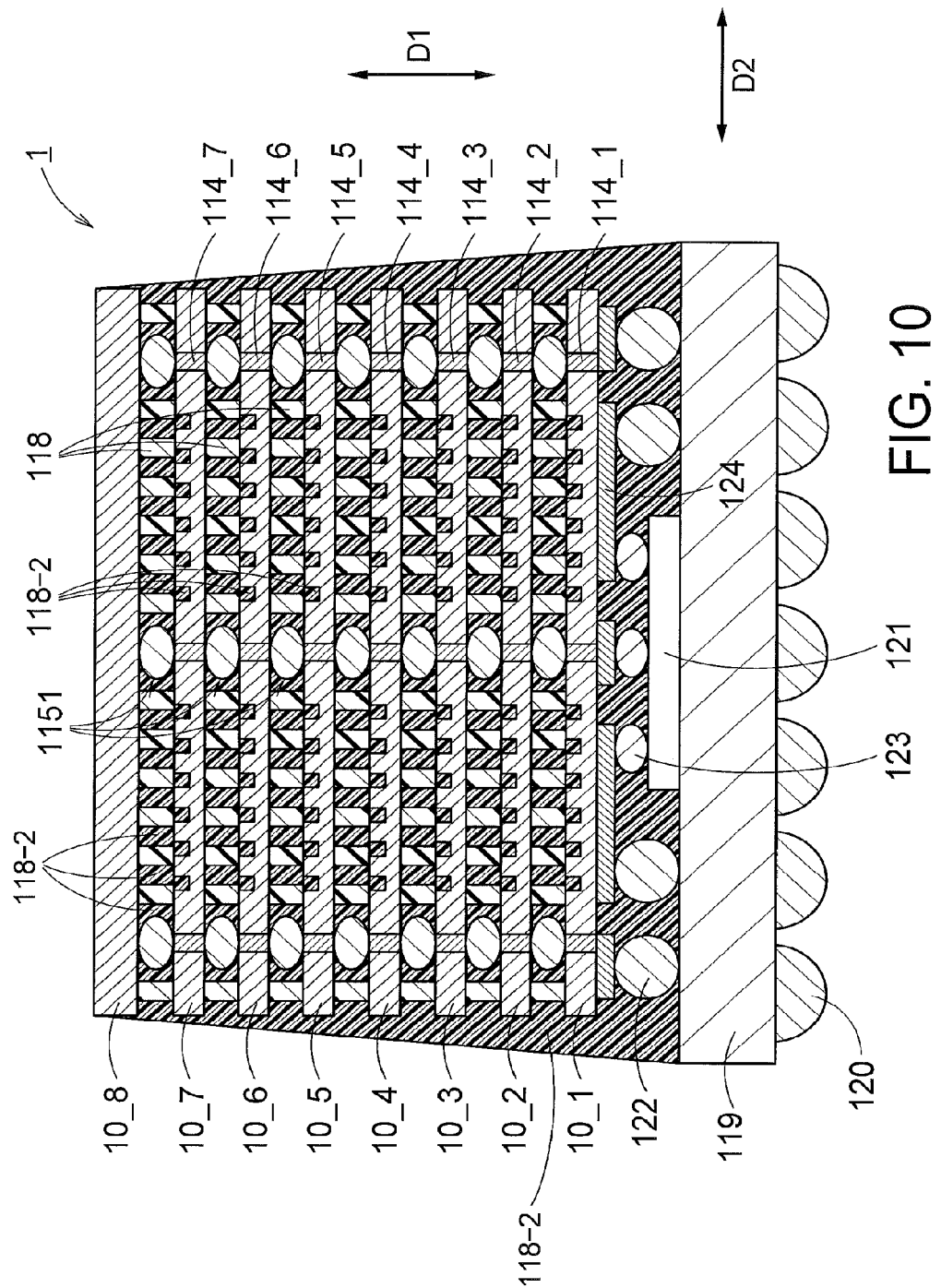
FIG. 10 is a schematic cross-sectional view of the semiconductor device 1 illustrating a first modification of the third embodiment.

Next, as a first modification of the third embodiment, an example of the semiconductor device in which a sealing resin is embedded in the slits is described. Notably, as to the description of the first modification, the same signs are used for constituent parts corresponding to those of the semiconductor device 1 in FIG. 9, and their duplicated description is omitted. FIG. 10 is a schematic cross-sectional view of the semiconductor device 1 illustrating the first modification of the third embodiment.

As illustrated in FIG. 10, the semiconductor device 1 of the first modification is different from the semiconductor device 1 in FIG. 9 in that the sealing resin 118-2 is included inside the slits 19 in place of the reinforcing films 117.

According to the first modification, the sealing resin 118-2 is embedded in the slits 19, and thereby, the sealing resin 118-2 can cause counterforce against stress of warpage to act on the silicon chips 10_1 to 10_7 even when the silicon chips 10_1 to 10_7 are about to warp. Accordingly, according to the semiconductor device 1 of the first modification, similarly to the semiconductor device 1 in FIG. 9, warpage of the silicon chips 10_1 to 10_7 can be securely suppressed. Moreover, since the sealing resin 118-2 can be embedded in the slits 19 when sealing is performed between the silicon chips 10_1 to 10_8 with the sealing resin 118-2, manufacturing efficiency can be improved.

(Second Modification)

Figure 11:
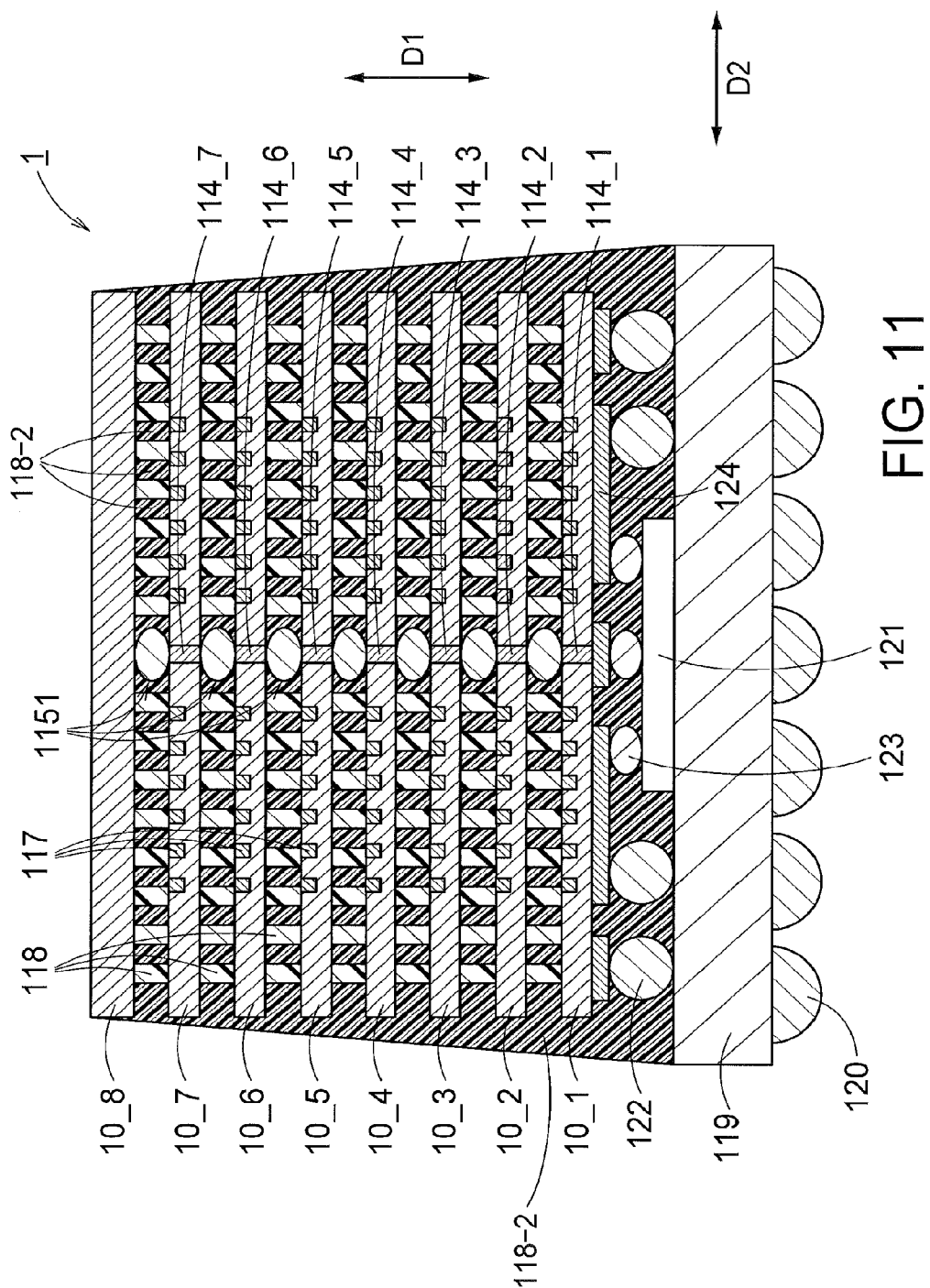
FIG. 11 is a schematic cross-sectional view of the semiconductor device 1 illustrating a second modification of the third embodiment.

Next, as a second modification of the third embodiment, an example of the semiconductor device in which TSVs are reduced. Notably, as to the description of the second modification, the same signs are used for constituent parts corresponding to those of the semiconductor device 1 in FIG. 9, and their duplicated description is omitted. FIG. 11 is a schematic cross-sectional view of the semiconductor device 1 illustrating the second modification of the third embodiment.

In the semiconductor device 1 of the second modification, the number of groups of TSVs in the stacking state is reduced contrarily to the semiconductor device 1 in FIG. 9. Also in the second modification, since stress of warpage of the silicon chips 10_1 to 10_7 can be relieved by the slits 19, the warpage of the silicon chips 10_1 to 10_7 can be suppressed. Moreover, since the reinforcing films 117 can reinforce the silicon chips 10_1 to 10_7, the warpage of the silicon chips 10_1 to 10_7 can be further effectively suppressed.

Notably, the shape of the slits 19 is not limited to a grid shape and a cross shape which have been already mentioned, but may also be, for example, a radial shape or the like. Moreover, when the plurality of slits 19 are intermittently formed, shapes and measurements of the slits 19 may also be different from one another.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor substrate;
   an insulating film disposed on a first surface of the semiconductor substrate, the insulating film covering a semiconductor element; and
   a conductive film penetrating the semiconductor substrate across from the first surface to a second surface opposite to the first surface,
   a trench across from a first end part side of the second surface to a second end part side thereof.

2. The semiconductor device according to claim 1, wherein the trench exists in a continuous grid shape.

3. The semiconductor device according to claim 1, wherein
   a plurality of the trenches exist intermittently, and
   at least one of the plurality of trenches exists in a cross shape.

4. The semiconductor device according to claim 1, wherein the trench exists over a whole surface of the second surface.

5. The semiconductor device according to claim 1, wherein at least part of the trench penetrates the semiconductor substrate across from the first surface to the second surface.

6. The semiconductor device according to claim 1, wherein the trench contains a bottomed groove.

7. The semiconductor device according to claim 1, comprising a reinforcing film disposed inside the trench.

8. The semiconductor device according to claim 1, comprising
   a plurality of the semiconductor substrates facing one another, wherein
   the conductive films are arranged in the plurality of semiconductor substrates so as to oppose each other,
   the semiconductor device comprising a joint between the conductive films that oppose each other.

9. The semiconductor device according to claim 7, wherein the reinforcing film comprises Ti, TiN, W, Al, Ni, Cu, SiO2, SiN or SiON.

10. The semiconductor device according to claim 8, wherein the semiconductor substrate is a silicon substrate.

11. The semiconductor device according to claim 1, wherein the conductive film is a Through-Silicon Via.

12. The semiconductor device according to claim 1, wherein the conductive film is supplied inside a through hole, the through hole being formed on the substrate.

13. The semiconductor device according to claim 1, wherein the conductive film comprises Ni.

14. The semiconductor device according to claim 1, wherein the conductive film is electrically connected to the semiconductor element.

15. The semiconductor device according to claim 1, further comprising:
   a bump on the semiconductor element, and
      wherein the conductive film is electrically connected to the semiconductor element on a first side of the semiconductor element, and a bump is electrically connected to the semiconductor element on a second side opposite to the first side of the semiconductor element.

* * * * *